United States Patent
Chen et al.

[11] Patent Number: 6,025,277
[45] Date of Patent: Feb. 15, 2000

[54] METHOD AND STRUCTURE FOR PREVENTING BONDING PAD PEEL BACK

[75] Inventors: Kun-Cho Chen, Taichung Hsien; Jason Jenq, Pingtung, both of Taiwan

[73] Assignee: United Microelectronics Corp., Taiwan

[21] Appl. No.: 09/058,959

[22] Filed: Apr. 13, 1998

Related U.S. Application Data

[60] Provisional application No. 60/045,929, May 7, 1997.

[51] Int. Cl.[7] .................................................. H01L 21/302
[52] U.S. Cl. .......................... 438/738; 438/397; 438/639; 438/640; 438/701; 438/702; 438/739; 438/740; 438/612; 438/614
[58] Field of Search .................................. 438/397, 639, 438/640, 701, 702, 740, 738, 739, 612, 614

[56] References Cited

U.S. PATENT DOCUMENTS

| | | | |
|---|---|---|---|
| 4,824,767 | 4/1989 | Chambers et al. | 430/313 |
| 4,829,024 | 5/1989 | Klein et al. | 438/653 |
| 5,436,188 | 7/1995 | Chen | 438/397 |
| 5,773,357 | 6/1998 | Shishiguchi | 438/479 |
| 5,796,133 | 8/1998 | Kwon et al. | 257/295 |
| 5,814,563 | 9/1998 | Ding et al. | 438/714 |
| 5,821,141 | 10/1998 | Huang | 438/253 |
| 5,843,847 | 12/1998 | Pu et al. | 438/723 |
| 5,869,403 | 2/1999 | Becker et al. | 438/738 |
| 5,877,092 | 3/1999 | Lee et al. | 438/738 |

FOREIGN PATENT DOCUMENTS

2-145292  6/1990  Japan .

*Primary Examiner*—Donald L. Monin, Jr.
*Assistant Examiner*—Alonzo Chambliss
*Attorney, Agent, or Firm*—Rabin & Champagne, PC

[57] ABSTRACT

Bonding pad structures may be fabricated by forming a layered structure including a first conducting layer and first and second insulating layers on top of a substrate. Openings are etched through the first and second insulating layers, with the openings being wider in the first insulating layer than in the second insulating layer. The etching process may be carried out in two steps, with the second step preferentially isotropically etching the first insulating layer so that the openings are wider in the first insulating layer than in the second insulating layer and a portion of the second insulating layer overhangs the opening above the first insulating layer. Metal is then deposited within the openings and on top of the second insulating layer. An interlocking structure is formed with the conducting material extending underneath of the overhang portions of the second insulating layer. A passivation layer may be formed over the conducting material. The conducting material may include a barrier layer, a plug, and a top bond pad layer.

24 Claims, 5 Drawing Sheets

METHOD AND STRUCTURE FOR PREVENTING BONDING PAD PEEL BACK

This Appln claims the benefit of U.S. Provisional No. 60/045,929 filed May 7, 1997.

BACKGROUND OF THE INVENTION

1. Field of the Invention

The present invention relates to a method and structure for improving the adhesion within bonding pads in a semiconductor integrated circuit.

2. Description of the Related Art

As electrical components are made smaller, various strategies have been adopted to reduce the amount of space devoted to connections between the chip containing the integrated circuit devices and the printed circuit board on which the chips are mounted. Electrical connections between integrated circuits on a chip and the printed circuit board are made through bonding pads typically provided at the periphery of the chip. Bonding pad structures may include a bonding metal layer and a barrier metal layer deposited over an underlying dielectric layer such as silicon oxide. The bonding metal layer is in electrical contact with one or more semiconductor devices in the chip. The barrier metal layer on the underlying dielectric layer helps adhere the bonding metal layer, typically aluminum, to the underlying dielectric layer. Conventional bonding pad structures have been observed to delaminate or have layers that separate from one another in response to external forces like those applied in wire bonding processes of the type typically used attaching wires to the bonding pads.

Connections between the bonding pads of a chip and the leads printed on the circuit board have conventionally been provided through the lead frame used as part of lead frame packaging methods. In such lead frame packaging methods, the chip is mounted to a frame which incorporates an array of electrical leads, with thin bonding wires connecting the bonding pads to the electrical leads on the lead frame. The entire chip and lead frame assembly is encapsulated in plastic and then mounted on the printed circuit board through the leads extending from the package. Variations on this basic structure have been introduced over the years. Gang bonding, which attaches multiple leads to multiple bonding pads in a single process step, has been facilitated by adoption of tape automated bonding (TAB) methods, in which some or all of the lead frame is replaced by leads printed on an insulating tape. The chip is attached to the tape at least through bonds between the tape leads and the chip's bonding pads and the chip and the tape assembly is encapsulated within the plastic package in a manner similar to that used with the lead frame. In another variation, the lead frame may be incorporated within a preformed portion of a package, such as a ceramic substrate or header, on which the chip is mounted and which forms a portion of the completed package.

An important advantage of lead frame packaging methods and variations on the lead frame packing methods is the protection provided to the chips by such a package. By connecting the bonding pads to the lead frame through bonding wires or leads, the bonding pads and the chip itself are isolated from external stresses after the initial assembly process. The plastic encapsulation protects the chip and stabilizes the connections between the bonding pads and the leads. Conventional lead frame packaging also has disadvantages. Forming lead frame packages is a complicated and therefore expensive process, so that providing the package is a considerable cost component for low price integrated circuit chips. It is thus desirable to reduce the costs associated with incorporating chips into printed circuit board based circuits. In some applications, the amount of space consumed by the lead frame and plastic package is unacceptable and prevents desired miniaturization of the printed circuit board assembly. For these applications, it is desirable to reduce the space consumed by the chip's packaging, so that the surface area of the printed circuit board devoted to the chip more closely matches the size of the chip.

Chip-on-board methods, where the semiconductor chip is mounted directly to the printed circuit board, have significant space and weight advantages over conventional lead frame packaging methods. Electrical connections between the bonding pads of the chip and the circuit board on which the chip is mounted are typically provided by wire bonding thin wires between the chips bonding pads and the leads printed on the board. The wire bonds may be formed using a variety of techniques including ultrasonic bonding and thermocompression bonding. Ultrasonic bonding uses ultrasonic waves or vibration to attach the wire to the bonding pad. Thermocompression bonding uses a combination of elevated temperature and compressive force to attach the wire to the bonding pad. Both of these bonding techniques impart mechanical and/or thermal energy directly to the bonding pad area and so can damage the bonding pad and the chip. Proper control of the process variables used in these techniques, such as bonding temperature, bonding load and ultrasonic vibration magnitude is important to the formation of high quality bonds and to the protection of the underlying chip.

It has been observed that wire bonding may cause the bonding pad to lift off or peel back (delaminate) from one or more of the underlying layers, weakening the bonding pad structure and damaging other portions of the chip's wiring. Such peel back reduces or prevents electrical contact between the bonding pad and the integrated circuit devices on the chip, which decreases the reliability and reduces the life of the chip. The stresses applied during wire bonding processes are much harder to control for chip-on-board assembly methods than for more conventional lead frame packaging technique for a number of reasons. For example, there are far greater variations in the thickness of printed circuit boards than there are in lead frames. Thus, for chip-on-board methods, there are greater variations in the position of the bonding pad with respect to the wire bonding equipment and so an increased likelihood that an appropriate level of force will be applied during wire bonding. In addition, the flexibility of the circuit board and the comparative inability of the circuit board to dissipate heat significantly increases the stresses associated with chip-on-board wire bonding processes as compared to those used in lead frame packaging techniques.

It is desirable to form bonding pad structures exhibiting improved durability with better adhesion to underlying layers, so that the bonding pad structures are more compatible with chip-on-board techniques.

SUMMARY OF THE PREFERRED EMBODIMENTS

One aspect of the present invention provides a method of making a bonding pad structure for a semiconductor device. A first conducting layer is formed over a substrate. First and second insulating layers are formed over the first conducting layer, with the second insulating layer having an upper surface. A first etch is performed using a first etchant to form contact openings through the second and first insulating layers. A second etch is performed using a second etchant that etches the first insulating layer more than the second insulating layer, wherein the at least one contact opening is larger in the first insulating layer than in the second insulating layer. Conducting material is provided within the contact openings and above the upper surface of the second insulating layer. A bonding surface is provided connected to the conducting material within the contact openings, the bonding surface being suitable for wire bonding and being anchored to the first conducting layer by the conducting material within the contact openings.

In another aspect, the conducting material within the contact openings and above the upper surface of the second insulating layer may be formed by a process including a number of deposition stages. A barrier conducting layer is deposited on the upper surface of the second insulating layer and within the contact openings through the first insulating layer and the second insulating layer. A conducting plug is deposited in the contact openings. A top conducting layer is deposited over the conducting plug and the barrier conducting layer.

Additional embodiments relate to a method for forming a bonding pad including forming an insulating region having a top insulating layer and a bottom insulating layer. An opening is formed through the top insulating layer and bottom insulating layer so that portions of the top insulating layer are on opposing sides of the opening and portions of the bottom insulating layer are on opposing sides of the opening. The opening is formed to be narrower between portions of the top insulating layer than between portions of the bottom insulating layer. Conducting material is deposited within the opening and a conducting layer is deposited above the top insulating layer.

Other embodiments relate to a bond pad structure for providing electrical contact to a semiconductor device. A first conducting layer is formed over an underlying layer. A first insulating layer is formed over the first conducting layer and a second insulating layer is formed over the first insulating layer. The second insulating layer includes an upper surface. A contact opening extends through the first and second insulating layers, the contact opening being wider between portions of the first insulating layer than between portions of the second insulating layer. Conducting material is placed within the contact opening and above the upper surface of the second insulating layer.

BRIEF DESCRIPTION OF THE DRAWINGS

Embodiments of the invention are described with reference to the accompanying drawings which, for illustrative purposes, are schematic and are not drawn to scale, where.

DESCRIPTION OF THE PREFERRED EMBODIMENTS

As devices are being scaled down to smaller geometries, problems arise due to the peel back or delamination of bonding pad layers during or after the formation of external contacts such as wiring bonds between the bonding pads and external circuits. This peeling back of the bonding pad layers causes there to be reduced electrical contact between the underlying device and the external contact, leading to decreased reliability and shorter component lifetimes. The present invention relates to a method for forming a bonding pad structure having improved layer adhesion. Preferred embodiments of the invention include a multilayer bonding pad structure including conducting layers and insulating layers configured so that the insulating portions of the bonding pad and the conducting portions of the bonding pad form an interlocking structure. The interlocking structure prevents the conductive layers from separating from one another or from underlying layers. Particularly preferred embodiments of the present invention provide a simple method for manufacturing an interlocking structure within a bonding pad. For example, the bonding pad may include lower and upper insulating layers having different etching properties so that, when openings are etched into the lower and upper insulating layers, the lower insulating layer is etched more rapidly so that the openings formed are wider at the lower end of the openings than at the upper end of the openings. Subsequent deposition of metal into the openings in the insulating structure naturally provides an interlocking structure.

Methods in accordance with embodiments of the invention may form a first conducting layer, onto which first and second insulating layers are deposited. The first and second insulating materials are preferably insulating materials such as glasses having different etching characteristics. A first etch step forms openings through the first and second insulating materials, with the first conducting layer preferably acting as an etch stop. A second etch step uses an etchant such as a buffered oxide to selectively etch the first insulating layer within the openings so that the first insulating layer is etched more than the second insulating layer. The second etch step yields a structure having a wider opening in the first insulating layer than in the second insulating layer due to the preferred etching of the first insulating layer within the opening. Conductive material can then be placed into the opening and above the second insulating layer to form a second conducting layer. Because the opening is wider in the first insulating layer than in the second insulating layer, portions of the second insulating layer overhang the opening over the first insulating layer. Portions of the second conducting layer will extend beneath the overhang portions of the second insulating layer within the opening. This interlocking structure reduces the likelihood of the second conducting layer peeling back or delaminating from the first conducting layer. A barrier layer, such as Ti or TiN, may be disposed between the first conducting layer and the second conducting layer. The structure will also prevent the second conducting layer from separating from the barrier layer. In addition, the conducting layer may also include a plug material such as tungsten within the opening, and another material such as an aluminum alloy above the second insulating layer and above the plug material.

Figure 1:
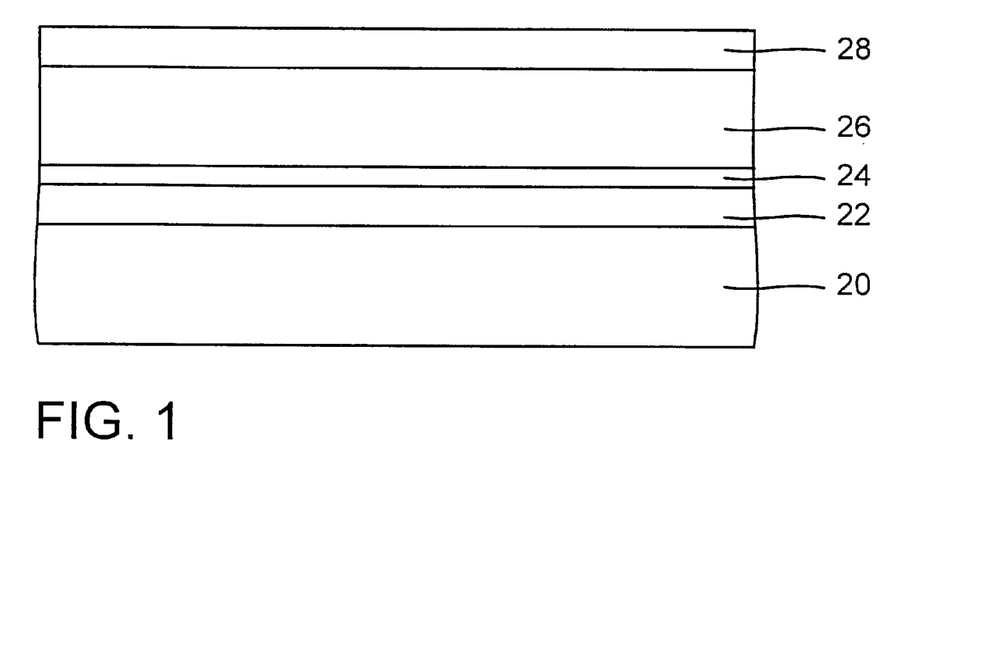
FIGS. 1–7 illustrate processing steps in the formation of a bonding pad structure according to embodiments of the present invention.

Preferred embodiments of the present invention will be discussed with reference to FIGS. 1–7. A small, peripheral portion of a substrate 20 is illustrated in FIG. 1; other portions of the substrate not shown in FIG. 1 have integrated circuit devices formed therein which will be connected directly or indirectly to one or more of the bonding pads provided on the peripheral portions of the substrate shown in FIG. 1. The illustrated portion of substrate includes an insulating layer such as field oxide layer 22. Layer 24, preferably made from polysilicon with a thickness of 2000–3000 Å which might be rendered conductive by n-type doping, is deposited over the field oxide layer 22. The layer 24 primarily serves as an etch stop for subsequent processing steps in the formation of the bonding pad structure and so need not be conductive to function according to the present invention. In certain embodiments, the layer 24 may also serve as part of an interconnect structure that connects the bonding pad to the integrated circuit devices. In such an embodiment, the polysilicon layer is preferably doped. Preferably, the polysilicon layer is patterned into an array of enlarged pads situated over thick field oxide regions in those locations where bonding pad structures are to be formed. For reference purposes, it should be appreciated that FIG. 1 shows only a small portion of the cross-section of the polysilicon pad 24 to better illustrate preferred structural aspects of the present invention. After the polysilicon layer has been patterned to provide pads over the field oxide regions 22 at the positions where the rest of the bonding structures are to be formed, the device is ready for formation of the insulator structure that forms part of the interlocking structure within the bonding pad.

It is preferred that the bonding pad structure incorporate an interlocking structure in which an insulating structure is formed over the conductor on the substrate, with the insulating structure having openings that narrow at the top. The openings in the insulating structure will form a physical interlocking structure when metal is deposited over the insulating structure and inside of the openings. Most preferably, the materials within the insulating structure are selected to simplify the construction of the interlocking structure. To this end, the insulating structure includes at least two layers, a lower first layer and an upper second layer. Preferably, the first and second insulating materials are chosen so that the two materials can be etched anisotropically in substantially the same manner using the same etchants. Such an anisotropic etching process is used to initially define a pattern of openings within the bonding pad structure having uniform cross-section viewed in plan view (down on the face of the bonding pad). The two insulating materials are chosen so that a second, preferably isotropic etching process can remove the first insulating layer more rapidly than it removes the second insulating layer. Preferably, the material used in the etch stop pad is selected to act as an etch stop for both the first and second etch steps. Polysilicon is a particularly useful material for the etch stop layer. Thus, the result of the second process will be to expand the openings formed in the first etching step to a greater extent within the first layer so that the openings are wider adjacent the first conductive layer. Consequently, when metal is deposited within the openings at a later stage in processing, the metal will naturally form an interlocking structure with the insulating structure.

Figure 2:
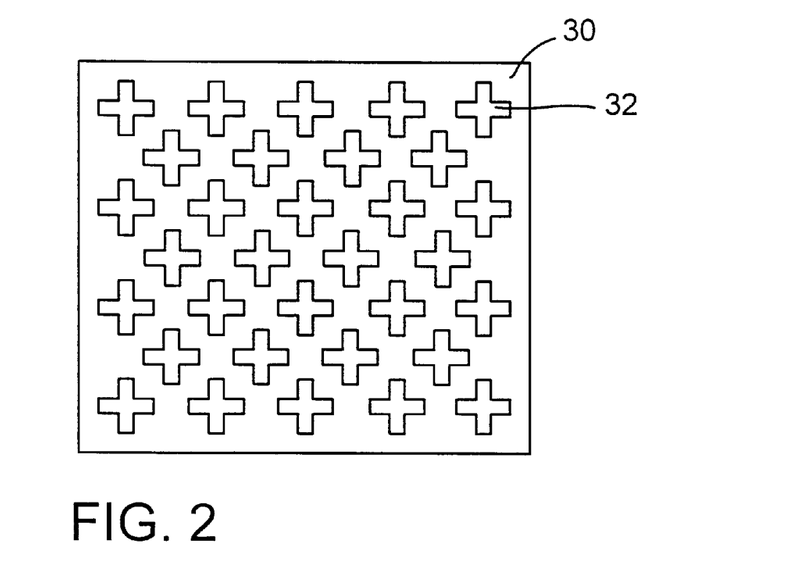
Figure 3:
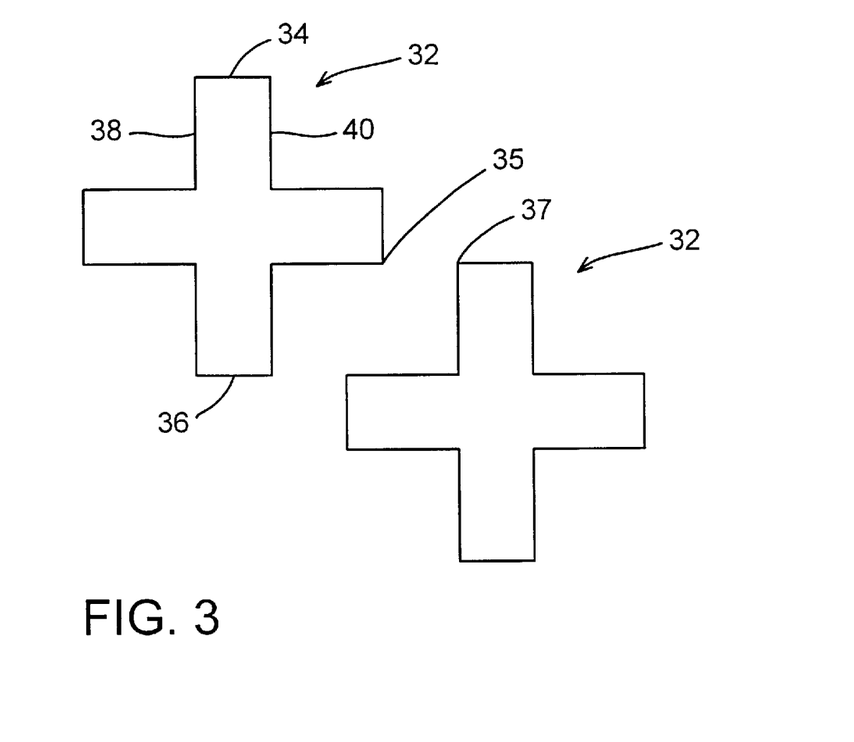

A first glass layer 26, preferably a doped glass and most preferably a borophosphosilicate glass (BPSG), is deposited onto the polysilicon layer 24. The BPSG layer preferably has a thickness of approximately 5000 Å. A second glass layer 28 that preferably has different etching characteristics than the first glass layer is deposited over the first glass layer 26. The second glass layer 28 is preferably an undoped silicate glass (USG) having a thickness of approximately 3000 Å. The BPSG layer 26 and USG layer 28 may be deposited using a variety of conventional techniques such as atmospheric pressure chemical vapor deposition (APCVD) or plasma-enhanced chemical vapor deposition (PECVD). A patterned photoresist masking layer 30 is then formed over the USG layer 28. The masking layer 30 is preferably patterned with cross-shaped S5 openings 32 as illustrated in FIG. 2. As illustrated in FIG. 3, the openings 32 may be distributed in rows that are offset from one another in order to fit more openings into the available space within a bonding pad. The distance between end walls 34 and 36 of opening 32 is preferably approximately 5 $\mu$m, and the distance between sidewalls 38 and 40 is preferably approximately 1 $\mu$m. A preferred orientation and spacing between adjacent openings 32 in the mask layer is illustrated in FIG. 3, which shows the corner endpoints 35 and 37 of adjacent openings 32. The corner endpoints 35 and 37 are preferably spaced approximately 1 $\mu$m apart.

Figure 4:
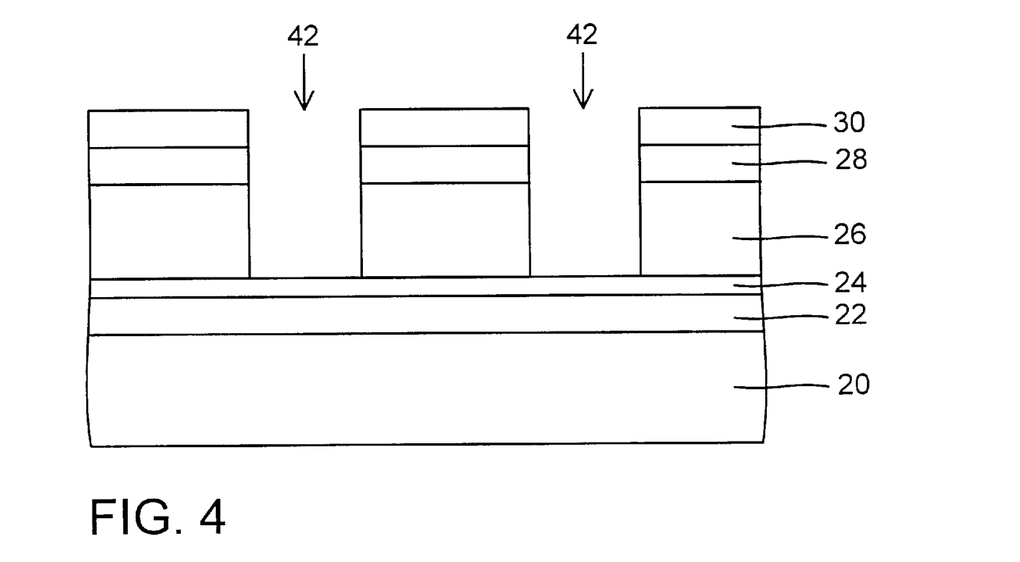
Figure 5:
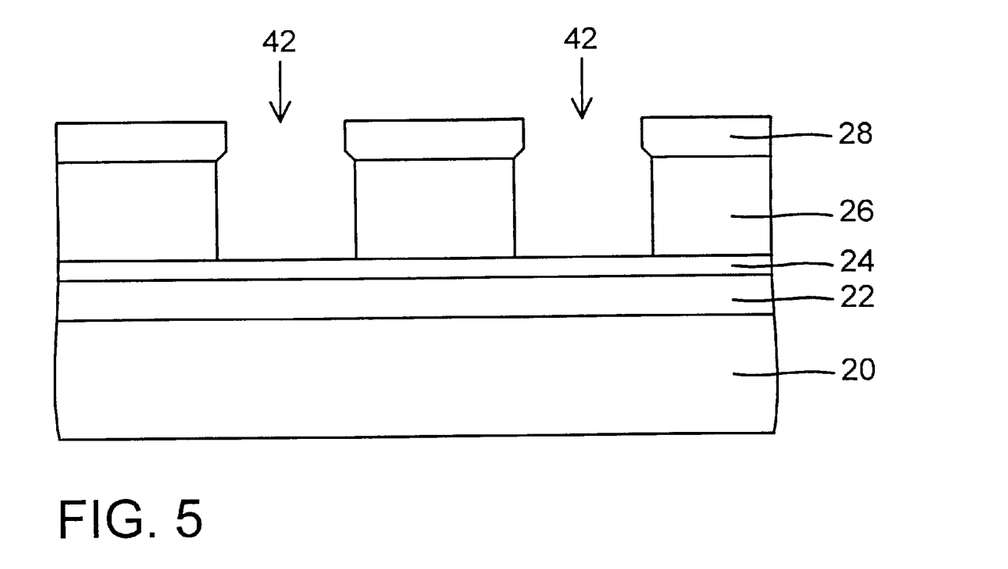

After the mask layer 30 is patterned, the exposed portions are dry etched, preferably anisotropically and preferably using an etchant derived from $CHF_3$ and/or $CF_4$, etching through the USG layer 28 and the BPSG layer 26 and stopping at etch stop layer 24, as illustrated in FIG. 4. The etching step yields contact openings 42 between remaining portions of the BPSG and USG glass layers 26 and 28. Next, an additional etch step is carried out, preferably using an isotropic etch and most preferably using a wet etch such as a buffered oxide etch (BOE). The etchant may be a buffered solution of hydrogen fluoride, for example, HF with an amount of $NH_4F$ added to buffer the solution while maintaining the strong etching properties of HF. Approximately a 6:1 ratio of $NH_4F$ to HF is preferred. The etching speed may be adjusted by adding water to the mixture of $NH_4F$ and HF, with a preferable etching time of approximately 1–2 minutes. The etchant preferentially etches the BPSG glass and forms a structure where the remaining USG layer 28 is wider and overhangs the contact openings 42 above the remaining BPSG layer 26, as illustrated in FIG. 5. Preferably, the USG layer 28 extends approximately 800 Å above the contact opening 42 as measured from the walls of the BPSG layer 26 on each side of the opening 42. Depending on the etching process chosen, the bottom portions of the USG layer 26 may also be slightly faceted, as illustrated in FIG. 5. Material subsequently deposited into the opening will be resistant to delamination due to the overhang portions of the USG layer 26.

Figure 6:
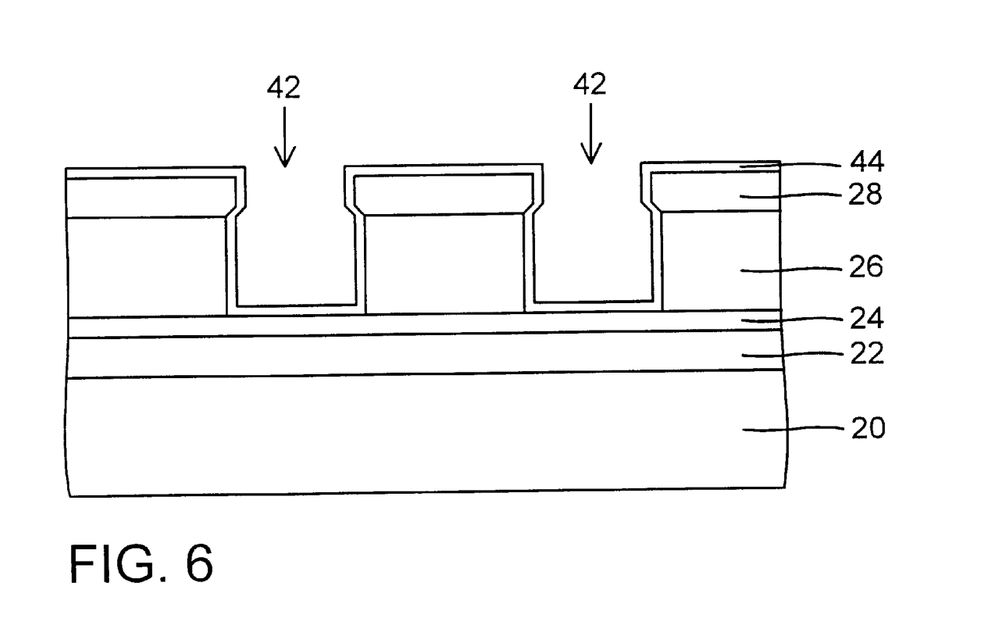
Figure 7:
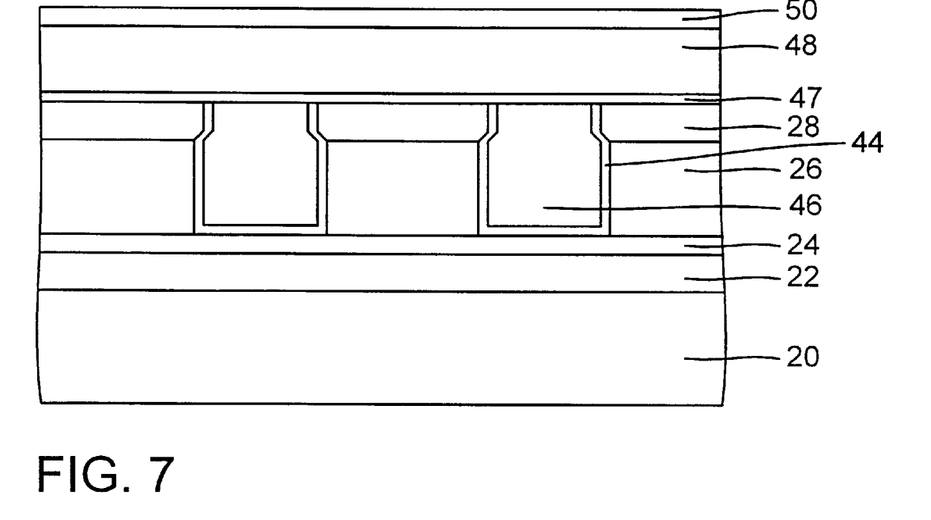

After the photoresist layer 30 has been removed by ashing or an equivalent process, a barrier layer 44, preferably titanium or titanium nitride, is then deposited within the contact openings 42 and over the exposed portions of the USG layer 28, as illustrated in FIG. 6. The preferred thickness for a titanium barrier layer is approximately 500 Å and the preferred thickness for a titanium nitride barrier layer is approximately 1000 Å. A conducting material, preferably a tungsten plug 46, is then deposited within the contact openings 42. The plug 46 may be formed by CVD of tungsten using $WF_6$ as a source gas. Other materials such as aluminum could also be used for the plug 46. The tungsten plug 46 may be deposited to overfill the contact opening 42 and an etch-back or polishing step is then carried out to remove excess tungsten on the portions of the barrier layer 44 on top of the USG layer 28. An etchant such as a plasma derived from $SF_6$ may be used in the etching process. This etch-back or polishing process also typically removes the barrier layer 44 from the upper surface of the second insulating layer 28. Since it is preferred to provide a barrier layer on the surface of the insulating layer to improve adhesion between deposited metal layers and the insulating layers, it is preferred that a second barrier or adhesion layer 47 be deposited over the device after the tungsten plug planarization process. This second barrier layer 47 is conveniently chosen to be of the same material as is used in the first barrier layer 44. Another conducting layer 48 is then deposited over the second barrier layer 47 and in electrical contact with the plug 46. The conducting layer 48 is preferably a metal such as an alloy of 99.5% aluminum and 0.5% silicon, sputtered to a thickness of approximately 8000 Å. The conducting layer 48 is then patterned to define the lateral extent of the bonding pad area. A passivation layer 50 may then be formed over the conducting layer 48. Preferred materials for passivation layer 50 include phosphorus silicate glass (PSG) and nitride materials such as silicon oxynitride. When it is desired to form an external contact to the bonding pad, the passivation layer 50 may be removed from over the bonding pad area and a wire bond or some other connection such as a bump bond is made to the conducting layer 48 of the bonding pad.

Figure 8:
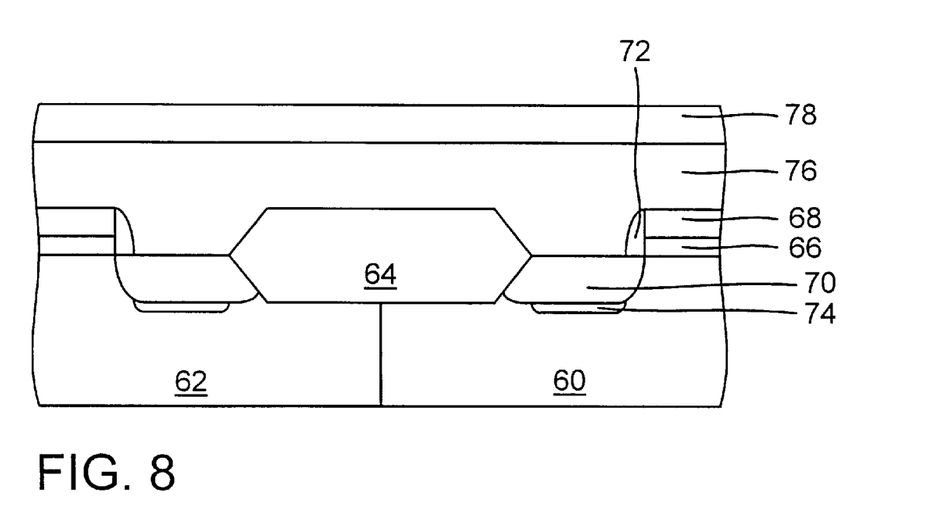
FIG. 8 illustrates the formation of a device for connection to a bonding pad structure according to embodiments of the present invention.

An example of a method for forming a device such as an output or input buffer that connects to a bonding pad according to embodiments of the present invention is as follows. The buffer may include an inverter formed partially within n-well 60 and p-well 62 formed in a silicon substrate, as illustrated in FIG. 8. Field oxide layer 64 is formed, for example, using a local oxidation of silicon (LOCOS) or shallow trench isolation method. One or more ion implantations for threshold voltage adjustment is carried out, followed by the formation of gate oxide layers 66 over each of the wells 60, 62. A conducting layer 68 such as polysilicon is formed over the gate oxide layer 66 and patterned to define the appropriate gate electrodes for each well region. Appropriate masking and implantation steps form lightly doped drain region 70, followed by the spacer 72 formation and additional implantations to form N+/P+ regions 74 as desired for the source/drain regions for each of the well regions. Dielectric layers 76 and 78 are deposited, with dielectric layer 76 preferably being BPSG and dielectric layer 78 preferably being USG glass in a manner similar to that described above for formation of the isolation portion of the preferred bonding pad structure. In this way, the contacts to the source/drain regions of the NMOS and PMOS portions of the input/output (I/O) buffer are formed at the same time as the bonding pad and preferably have the same interlocking nature as the bonding pad.

Figure 9:
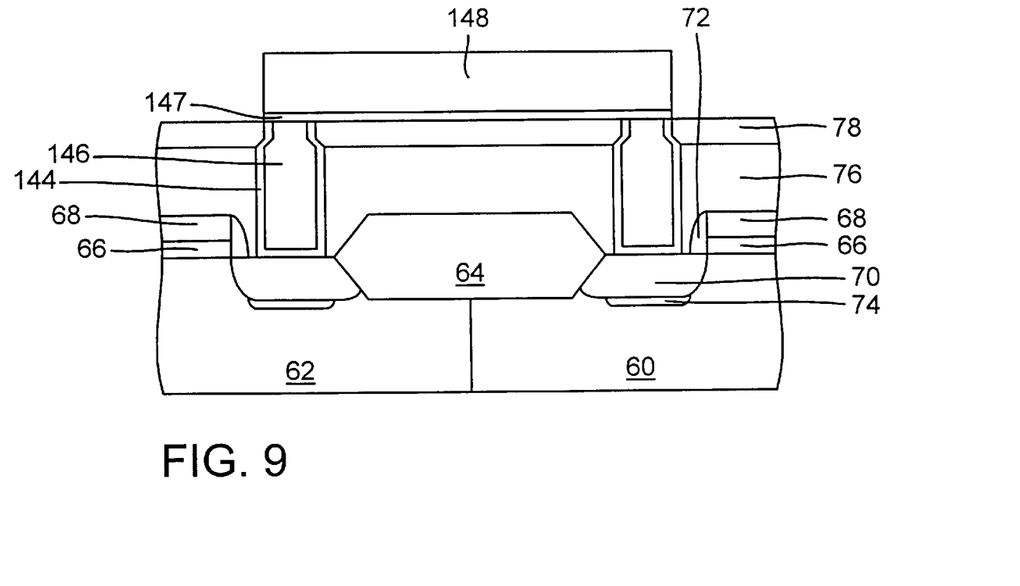
FIG. 9 illustrates the formation of a device including a connection to a bonding pad structure according to embodiments of the present invention.
Figure 10:
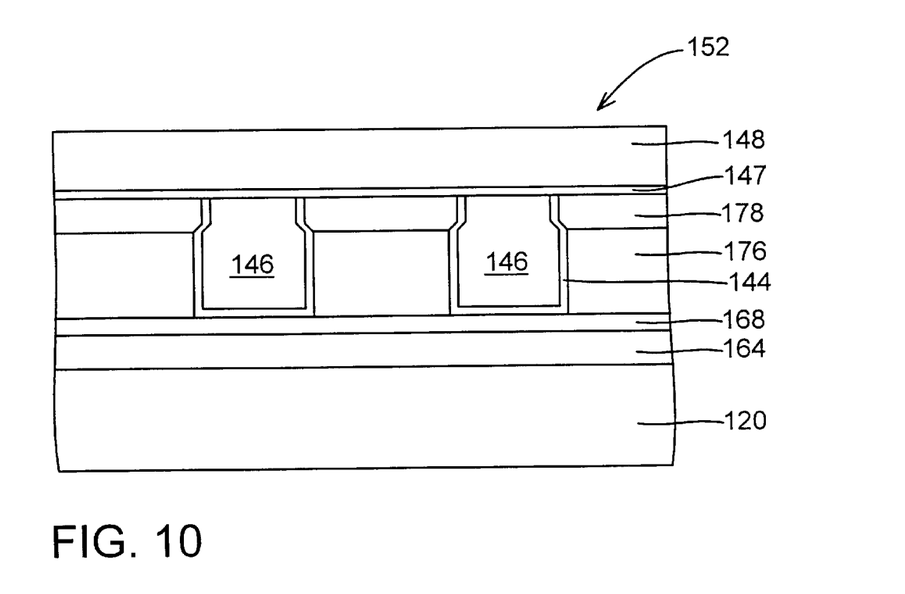
FIG. 10 illustrates the formation of a bonding pad structure that may be connected to a semiconductor device according to embodiments of the present invention.

Depending on the size of the field oxide layer 64, the bonding pad may be located directly above the field oxide layer 64 or may be located some distance away from the field oxide layer 64. Preferred bonding pads have dimensions of approximately 100 μm by approximately 100 μm. Such dimensions are likely much larger than the size of the field oxide layer 64 shown in FIG. 8. In such a case, connections from the underlying device to the bonding pad may be made through conductors 146 that are in contact with the device at the substrate surface and in contact directly or indirectly with a portion of bonding pad conducting layer 148, as illustrated in FIG. 9. The bonding pad conducting layer 148 shown in FIG. 9 extends to bonding pad contact area 152 shown in FIG. 10. The bonding pad contact area 152 shown in FIG. 10 includes the bonding pad conducting layer 148, which overlies second barrier layer 147, plug 146, first barrier layer 144, first and second dielectric layers 176 and 178, etch stop or conducting layer 168, field oxide layer 164 and substrate 120. The field oxide layer 164 may be formed at the same time that the field oxide layer 64 was formed as described above. Above the field oxide layer 164 are conducting layers 168, first dielectric layer 176 and second dielectric layer 178, which may all be formed at the same time that layers 68, 76 and 78 were formed as described above.

After the first and second dielectric layers 176 and 178 have been deposited, a pattern is formed over the over the second dielectric layer 178 using conventional lithographic techniques and the exposed portions are etched, preferably using a dry etch derived from $CHF_3$ and/or $CF_4$, in order to etch through the dielectric layers 178 and 176 and stopping at conducting layer 168, which serves as an etch stop. The etching step yields openings between remaining portions of the dielectric layers 176 and 178. A second etch step is carried out, preferably using a buffered oxide etch (BOE). The etchant is preferably a buffered hydrogen fluoride, for example, having a 6:1 ratio of $NH_4F$ to HF. The etchant preferentially etches layer 176, forming a wider opening within the layer 176 than within the layer 178. A glue and/or barrier layer 144, such as TiN, is deposited within the opening and on the dielectric layer 178 surface. Next a conducting material such as a CVD tungsten plug 146 is deposited into the opening. The tungsten plug 146 may overfill the opening and coat barrier layer 144 on the dielectric layer 178. A tungsten etch-back step may be carried out using an etchant such as $SF_6$ to remove the excess tungsten. Conducting layer 148, preferably a metal such as 99.5% Al and 0.5% Cu, may then be deposited over the tungsten plug 146 and a second barrier layer 147 deposited after tungsten plug planarization. The conducting layer 148 may then be patterned to define the bonding pad surface. A protective passivation layer such as PSG or an oxynitride material (which is removed prior to making an external contact to the bonding pad), may be deposited above the bonding pad conducting layer 148. The conducting layer 148, as described above, is in electrical contact with the device illustrated in FIG. 9.

While the present invention has been described with particular emphasis on certain preferred embodiments, those of ordinary skill will appreciate that various modifications and alterations to the described embodiments can be made without altering the basic function of the present invention. For example, while the above description has shown the contacts to I/O circuits being formed at the same time that the interlocking bonding pad structure is formed, this need not be the case. The scope of the invention is not limited to the particular embodiments described herein; rather, the scope of the present invention is to be determined by the following claims.

What is claimed:

1. A method for forming a bonding pad structure for a semiconductor device, comprising the steps of:

forming a first conducting layer over a substrate;

forming a first insulating layer over the first conducting layer;

forming a second insulating layer over the first insulating layer, the second insulating layer having a composition sufficiently different from the first insulating layer as to have different etch characteristics for at least some etchants, the second insulating layer having an upper surface;

performing a first etch using a first etchant to form contact openings through the second insulating layer and the first insulating layer;

performing a second etch using a second etchant that etches the first insulating layer more than the second insulating layer, wherein the contact openings are larger in the first insulating layer than in the second insulating layer;

providing a conducting material within the contact openings and above the upper surface of the second insulating layer, wherein the conducting material is deposited by a process including:

depositing a barrier conductive layer on the upper surface of the second insulating layer and within the contact openings;

depositing a conducting plug in the contact openings so that it overflows the contact openings and deposits on top of the barrier conducting layer, and etching back the conducting plug to remove plug material from the top of the barrier conducting layer on the upper surface of the second insulating layer; and depositing a top conducting layer over the conducting plug and the barrier conducting layer; and providing a bonding surface connected to the conducting material within the contact openings, the bonding surface being suitable for wire bonding and being anchored to the first insulating layer by the conducting material within the contact openings.

2. The method of claim 1, further comprising the step of forming a barrier conducting layer on the upper surface of the second insulating layer, within the contact openings through the first insulating layer and the second insulating layer, and on surfaces of the first conducting layer exposed within the contact openings.

3. The method of claim 1, wherein the first conducting layer comprises polysilicon.

4. The method of claim 1, wherein the first insulating layer comprises borophosphosilicate glass.

5. The method of claim 1, wherein the second insulating layer comprises undoped silicate glass.

6. The method of claim 1, wherein the first etchant is derived from one or more gases selected from the group consisting of $CHF_3$ and $CF_4$.

7. The method of claim 1, wherein the second etchant comprises a buffered oxide etchant.

8. The method of claim 7, wherein the second etchant comprises $NH_4F$ and HF.

9. The method of claim 1, wherein the barrier conducting layer is formed by rapid thermal processing in an environment containing nitrogen.

10. The method of claim 1, wherein the barrier conducting layer comprises at least one material selected from the group consisting of Ti and TiN.

11. The method of claim 1, wherein the conducting plug is formed using chemical vapor deposition.

12. The method of claim 1, wherein the conducting plug comprises tungsten.

13. The method of claim 1, wherein the top conducting layer is deposited using sputtering and comprises at least one material selected from the group consisting of Al and Cu.

14. The method of claim 1, further comprising the step of forming a passivation layer over the top conducting layer, the passivation layer comprising a material selected from the group consisting of a nitride and a phosphorous silicate glass.

15. A method for forming a bonding pad comprising the steps of:

forming an insulating region having a top insulating layer and a bottom insulating layer;

forming at least one opening through the top insulating layer and the bottom insulating layer so that portions of the top insulating layer are on opposing sides of the at least one opening and portions of the bottom insulating layer are on opposing sides of the at least one opening;

wherein the at least one opening is narrower between portions of the top insulating layer than between portions of the bottom insulating layer;

depositing a conducting material within the at least one opening, wherein the conducting material is deposited by a process including:

depositing a barrier conducting layer on an upper surface of the top insulating layer and within the contact opening; and depositing a conducting plug in the contact opening so that it overflows the contact opening and deposits on top of the barrier conducting layer, and etching back the conducting plug to remove plug material from the top of the barrier conducting layer on the upper surface of the top insulating layer; and depositing a conducting layer above the at least one opening and above an upper surface of the top insulating layer, wherein the conducting layer electrically contacts the conducting material deposited within the at least one opening.

16. The method of claim 15, wherein the at least one opening is formed by first removing material from the first and second layers to form an open region and second exposing the top layer and bottom layer in the open region to an etchant that etches the bottom layer more than the top layer.

17. The method of claim 15, further comprising the steps of forming an etch stop layer below the bottom insulating layer.

18. The method of claim 17, wherein the etch stop layer comprises silicon.

19. The method of claim 18, wherein the opening is formed by etching through the top and bottom insulating layers, wherein the bottom layer is etched more than the top layer, and wherein the opening terminates on the etch stop layer.

20. The method of claim 18, wherein the opening is formed in a two stage etching process through the first and second insulating layers and stopping on the etch stop layer, wherein the first stage includes subjecting a portion of the insulating region to a first etchant that etches through the top and bottom insulating layers, and the second stage includes subjecting a portion of the insulating region to a second etchant that etches the bottom insulating layer more than the top insulating layer.

21. The method of claim 20, wherein the first stage includes anisotropic etching and the second stage includes isotropic etching.

22. The method of claim 20, wherein the first etchant comprises an anisotropic etchant and the second etchant comprises an isotropic etchant.

23. The method of claim 22, wherein the second etchant comprises a buffered oxide etchant.

24. The method of claim 20, wherein the top insulating layer comprises a borophosphosilicate glass and the bottom insulating layer comprises an undoped silicate glass.

* * * * *